(12) United States Patent
Lee et al.

(10) Patent No.: US 11,289,567 B2
(45) Date of Patent: Mar. 29, 2022

(54) DISPLAY DEVICE INCLUDING COLOR FILTER AND LIGHT SHIELDING LAYER

(71) Applicant: Samsung Display Co., Ltd., Yongin-si (KR)

(72) Inventors: Seungrok Lee, Hwaseong-si (KR); Dohyun Kwon, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/886,582

(22) Filed: May 28, 2020

(65) Prior Publication Data
US 2021/0005698 A1 Jan. 7, 2021

(30) Foreign Application Priority Data

Jul. 3, 2019 (KR) .......................... 10-2019-0080338

(51) Int. Cl.
*H01L 27/32* (2006.01)
*H01L 51/52* (2006.01)
(Continued)

(52) U.S. Cl.
CPC ........ *H01L 27/3276* (2013.01); *H01L 27/322* (2013.01); *H01L 27/3225* (2013.01); *H01L 51/5237* (2013.01); *H01L 51/5284* (2013.01); *G02F 1/133514* (2013.01); *G02F 1/133519* (2021.01); *H01L 27/3272* (2013.01)

(58) Field of Classification Search
CPC ............... H01L 27/3276; H01L 27/322; H01L 27/3225; H01L 27/3272; H01L 51/5237; H01L 51/5284; H01L 51/5253; G02F 1/133514; G02F 1/133519; G02F 2001/136222
See application file for complete search history.

(56) References Cited

U.S. PATENT DOCUMENTS 8,698,982 B2 *  4/2014  Tsuchiya ........... G02F 1/133528
                                                        349/96
9,052,554 B2 *  6/2015  Ota ................... G02F 1/136227
(Continued)

FOREIGN PATENT DOCUMENTS

KR      10-1820382         1/2018
KR      10-2018-0036325    4/2018
(Continued)

*Primary Examiner* — Ida M Soward
(74) *Attorney, Agent, or Firm* — H.C. Park & Associates, PLC

(57) ABSTRACT

A display device includes a base substrate, a drive chip disposed on the base substrate, a signal line group including a first signal line having a first sub line connected to the drive chip and a second sub line which overlaps a display region and is spaced apart from the first sub line when viewed in a plane, an insulating layer disposed on the base substrate, a first connection line including one end connected to the first sub line through a first contact hole and the other end connected to the second sub line through a second contact hole, an encapsulation layer disposed on the insulating layer, a light shielding layer for overlapping the first connection line when viewed in the plane, and a color filter layer which is disposed on the light shielding layer and includes a plurality of color filters divided by the light shielding layer.

20 Claims, 14 Drawing Sheets

(51) Int. Cl.
*G02F 1/13* (2006.01)
*G02F 1/1335* (2006.01)

(56) References Cited

U.S. PATENT DOCUMENTS

| | | | |
|---|---|---|---|
| 9,490,312 B2* | 11/2016 | Lee | H01L 51/0097 |
| 9,983,714 B2* | 5/2018 | Ahn | H01L 27/3262 |
| 10,038,154 B2* | 7/2018 | Lee | H01L 51/5246 |
| 10,043,827 B2* | 8/2018 | Kwon | H01L 27/1222 |
| 10,191,606 B2* | 1/2019 | Furuhashi | G09G 3/3611 |
| 10,230,063 B2* | 3/2019 | Jang | B32B 7/12 |
| 10,359,662 B2* | 7/2019 | Uchida | G02F 1/13452 |
| 10,381,598 B2* | 8/2019 | Son | H01L 51/5253 |
| 10,401,560 B2* | 9/2019 | Kawata | G02F 1/134309 |
| 10,476,038 B2* | 11/2019 | Park | H01L 51/5284 |
| 10,866,663 B2* | 12/2020 | Jun | G06F 3/04164 |
| 11,100,877 B2* | 8/2021 | Yeh | G02F 1/136286 |
| 11,106,297 B2* | 8/2021 | Kim | G06F 3/0412 |
| 2010/0123844 A1* | 5/2010 | Um | G02F 1/133707 349/39 |
| 2016/0043336 A1* | 2/2016 | Kim | H01L 51/003 257/40 |
| 2017/0371199 A1* | 12/2017 | Maede | G02F 1/136286 |
| 2018/0061894 A1* | 3/2018 | Kim | H01L 51/5268 |
| 2018/0095566 A1 | 4/2018 | Lee et al. | |
| 2018/0095584 A1 | 4/2018 | Lee et al. | |
| 2018/0120646 A1* | 5/2018 | Lee | H01L 27/322 |
| 2018/0151628 A1* | 5/2018 | Park | H01L 51/5218 |
| 2018/0188866 A1* | 7/2018 | Heo | H01L 51/5253 |
| 2018/0364521 A1* | 12/2018 | Baek | G02B 5/3058 |
| 2019/0025634 A1 | 1/2019 | Park et al. | |
| 2019/0165068 A1* | 5/2019 | Park | H01L 27/3272 |
| 2019/0258099 A1* | 8/2019 | Ozeki | G02F 1/133345 |
| 2019/0296088 A1* | 9/2019 | Kim | H01L 51/5268 |
| 2020/0073169 A1* | 3/2020 | Jung | G02F 1/134309 |
| 2020/0357858 A1* | 11/2020 | Jo | G06F 3/044 |

FOREIGN PATENT DOCUMENTS

| | | |
|---|---|---|
| KR | 10-1926527 | 4/2018 |
| KR | 10-1909934 | 10/2018 |
| KR | 10-2018-0132010 | 12/2018 |
| KR | 10-2019-0010821 | 1/2019 |

* cited by examiner

DISPLAY DEVICE INCLUDING COLOR FILTER AND LIGHT SHIELDING LAYER

CROSS REFERENCE TO RELATED APPLICATION

This application claims priority from and the benefit of Korean Patent Application No. 10-2019-0080338, filed on Jul. 3, 2019, which is hereby incorporated by reference for all purposes as if fully set forth herein.

BACKGROUND

Field

Exemplary embodiments/implementations of the invention relate generally to display devices, and, more specifically, to a display device with a non-display region reduced.

Discussion of the Background

A variety of display devices are developed which are used in multimedia devices such as a television, a mobile phone, a tablet computer, a navigation device, and a game machine. A display device may include a display module that displays an image and senses an external input, a polarization layer disposed on a display panel, and a window. The display module may include the display panel for displaying an image and an input sensing layer for sensing an external input. An image outputted through the display panel may be viewed through the window.

The display device includes a display region that shows an image through the window and a non-display region adjacent to the display region.

The above information disclosed in this Background section is only for understanding of the background of the inventive concepts, and, therefore, it may contain information that does not constitute prior art.

SUMMARY

The present disclosure provides a display device in which a non-display region may be reduced and a circuit element may be prevented from being viewed from the outside.

Additional features of the inventive concepts will be set forth in the description which follows, and in part will be apparent from the description, or may be learned by practice of the inventive concepts.

An embodiment of the inventive concept provides a display device including: a base substrate in which a display region and a non-display region adjacent to the display region are defined; a drive chip configured to overlap the non-display region and disposed on the base substrate; a signal line group which is disposed on the base substrate and includes a first signal line having a first sub line electrically connected to the drive chip and a second sub line configured to overlap the display region and spaced apart from the first sub line when viewed in a plane; an insulating layer configured to cover the signal line group and disposed on the base substrate; a first connection line which overlaps the display region, is disposed on the insulating layer, and includes one end electrically connected to the first sub line through a first contact hole defined in the insulating layer and the other end electrically connected to the second sub line through a second contact hole defined in the insulating layer; an encapsulation layer configured to cover the first connection line and disposed on the insulating layer; a light shielding layer disposed on the encapsulation layer and configured to overlap the first connection line when viewed in the plane; and a color filter layer which is disposed on the light shielding layer and includes a plurality of color filters divided by the light shielding layer.

In an embodiment, the display region may include a plurality of pixel regions and a light shielding region which is adjacent to the pixel regions and is defined by the light shielding layer, wherein the first connection line entirely overlaps the light shielding region.

In an embodiment, an optical density of the light shielding layer may be from about 1.0 to about 4.0.

In an embodiment, the pixel regions may include first to third pixel regions, wherein the color filters include: a first color filter which overlaps the first pixel region and has a first color; a second color filter which overlaps the second pixel region and has a second color different from the first color; and a third color filter which overlaps the third pixel region and has a third color different from the first color and the second color.

In an embodiment, the first sub line may at least partially overlap the first connection line when viewed in the plane.

In an embodiment, the first sub line and the second sub line may be disposed on the same layer.

In an embodiment, the signal line group may further include: a second signal line having a third sub line electrically connected to the drive chip and a fourth sub line spaced apart from the third sub line when viewed in the plane; and a central signal line electrically connected to the drive chip and configured to overlap each of the display region and the non-display region.

In an embodiment, the third sub line may be disposed between the first sub line and the central signal line when viewed in the plane.

In an embodiment, the display device may further include a second connection line which overlaps the display region, is disposed on the insulating layer, and includes one end electrically connected to the third sub line through a third contact hole defined in the insulating layer and the other end electrically connected to the fourth sub line through a fourth contact hole defined in the insulating layer.

In an embodiment, the second connection line may at least partially overlap the second sub line when viewed in the plane.

In an embodiment, the first connection line and the second connection line may be disposed on the same layer.

In an embodiment, the third sub line and the fourth sub line may be disposed on different layers, and the fourth sub line and the first connection line may be disposed on different layers.

In an embodiment, the display device may further include an intermediate insulating layer disposed between the base substrate and the insulating layer and provided as an organic film, wherein the first signal line, the central signal line, and the third sub line are disposed on the intermediate insulating layer.

In an embodiment, the central signal line may be provided in an integral shape through a single process.

In an embodiment, the first connection line may have a shape that is bent at least once when viewed in the plane.

In an embodiment, the first contact hole and the second contact hole may overlap the display region.

In an embodiment, the signal line group may include a plurality of data lines arranged on the base substrate, wherein the first signal line corresponds to one outermost data line of the data lines.

In an embodiment, the display device may further include an input sensing layer disposed between the encapsulation layer and the color filter layer, wherein the input sensing layer includes a plurality of conductive patterns configured to overlap the light shielding layer.

In an embodiment, the insulating layer may be an organic film.

In an embodiment, the non-display region may include a bent region, and at least a portion of the first sub line may be bent.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
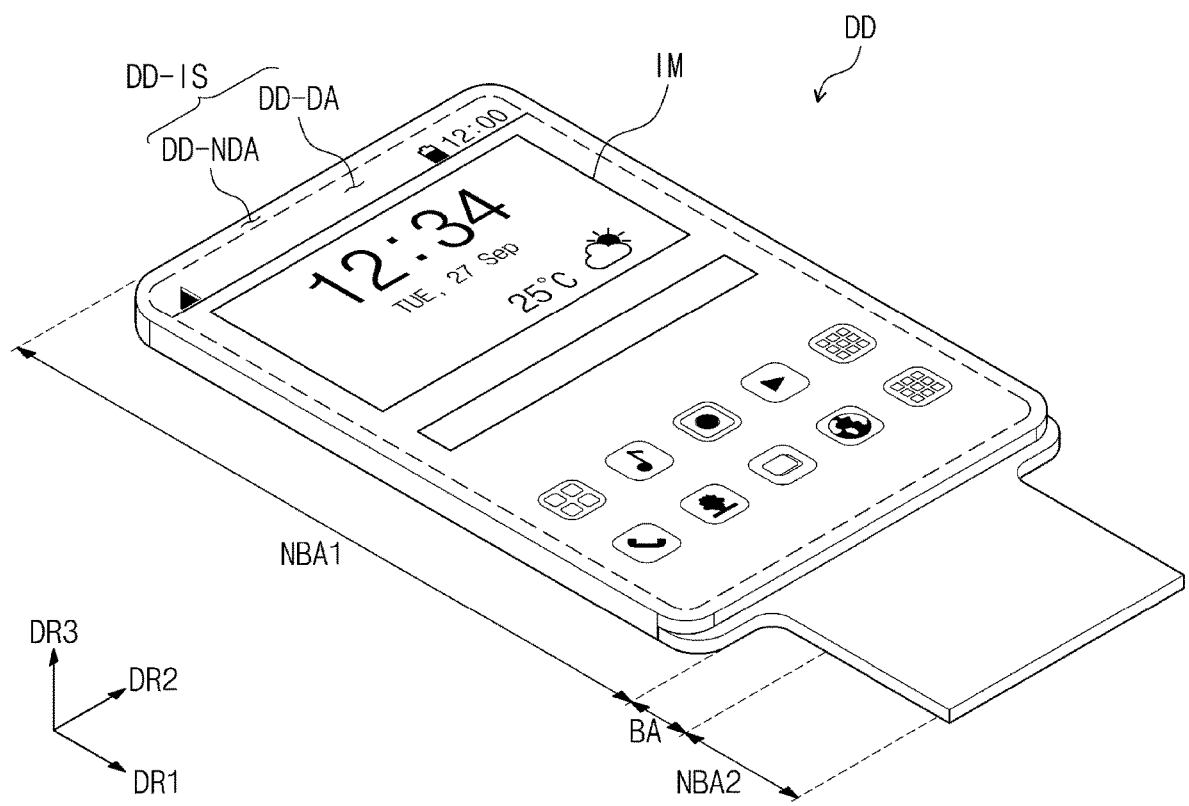
FIG. 1A and FIG. 1B are perspective views of a display device constructed according to an embodiment of the inventive concept.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
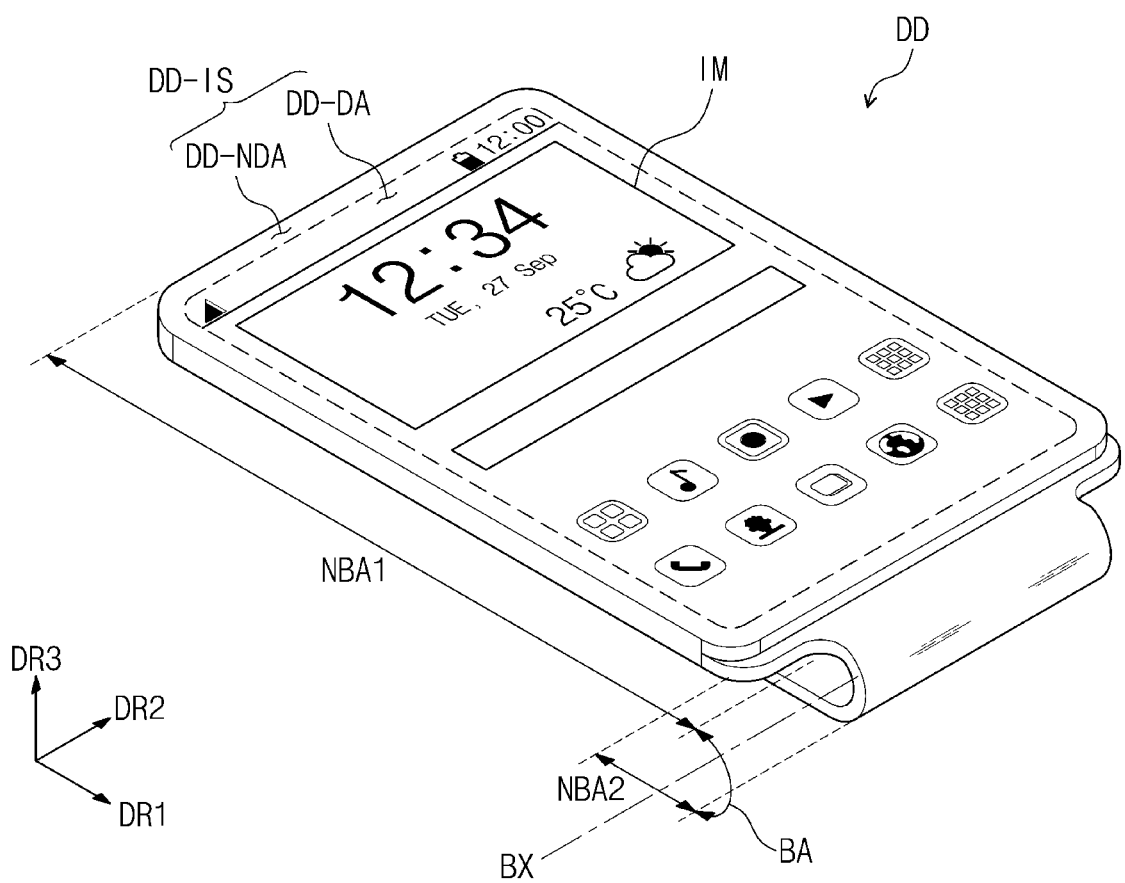

FIG. 1A and FIG. 1B are perspective views of a display device according to an embodiment of the inventive concept.

A display device DD applicable to a mobile phone is illustrated in FIGS. 1A and 1B by way of example. Although not illustrated, electronic modules, a camera module, a power supply module, and the like mounted on a main board may be disposed in a bracket/case together with the display device DD to constitute a mobile phone. The display device DD according to an embodiment of the inventive concept may be applied to large-sized electronic devices such as a television and a monitor, and to medium- and small-sized electronic devices such as a tablet, a car navigation device, a game machine, and a smart watch.

A display surface DD-IS may have a shape extending in a first direction DR1 and a second direction DR2 crossing the first direction DR1. A normal direction of the display surface DD-IS, that is, a thickness direction of the display device DD is indicated by a third direction DR3. In this specification, "when viewed in a/the plane" or "on a/the plane" may mean a case of viewing in the third direction DR3. A front surface (or a top surface) and a rear surface (or a bottom surface) of each of layers or units described below are distinguished relative to the third direction DR3. However, directions indicated by the first to third directions DR1 to DR3 are based on a relative concept, and may be converted into other directions, for example, opposite directions.

According to an embodiment of the inventive concept, at least a portion of the display surface DD-IS may include a curve when viewed in a plane. For example, a corner portion of the display surface DD-IS may have a curved shape. According to another embodiment, the display surface DD-IS may be parallel to a surface defined by the first direction DR1 and the second direction DR2. In this case, the display surface DD-IS may be provided in a quadrangular shape. On the other hand, although a portion of the display device DD is described as having a curved display surface DD-IS when viewed in a plane, the display device DD may also include a three-dimensional display surface. A three-dimensional display surface includes a plurality of display regions facing directions different from each other, and may include, for example, a polygonal columnar display surface.

As illustrated in FIG. 1A, the display surface DD-IS includes a display region DD-DA in which an image IM is displayed and a non-display region DD-NDA adjacent to the display region DD-DA. The non-display region DD-NDA may be a region where no image is displayed. A clock window and icon images are illustrated in FIG. 1A as an example of the image IM.

In particular, the display device DD according to an embodiment of the inventive concept may include a first non-bent region NBA1, a second non-bent region NBA2, and a bent region BA. The first non-bent region NBA1, the second non-bent region NBA2, and the bent region BA may be set on the basis of a display panel DP to be described later with reference to FIG. 3.

When viewed in a plane, the display device DD may have a different width in the second direction DR2 for each of the regions. The bent region BA and the second non-bent region NBA2 may have widths in the second direction DR2 smaller than a maximum width of the first non-bent region NBA1 in the second direction DR2. Because the bent region BA has a smaller width than the first non-bent region NBA1, the display device DD may be bent easily.

FIG. 1B illustrates the display device DD in a bent state. The bent region BA is bent around a bending axis BX extending in the second direction DR2. When the display device DD is bent, the second non-bent region NBA2 faces the first non-bent region NBA1 and is spaced apart from the first non-bent region NBA1 in the third direction DR3.

Figure 2:
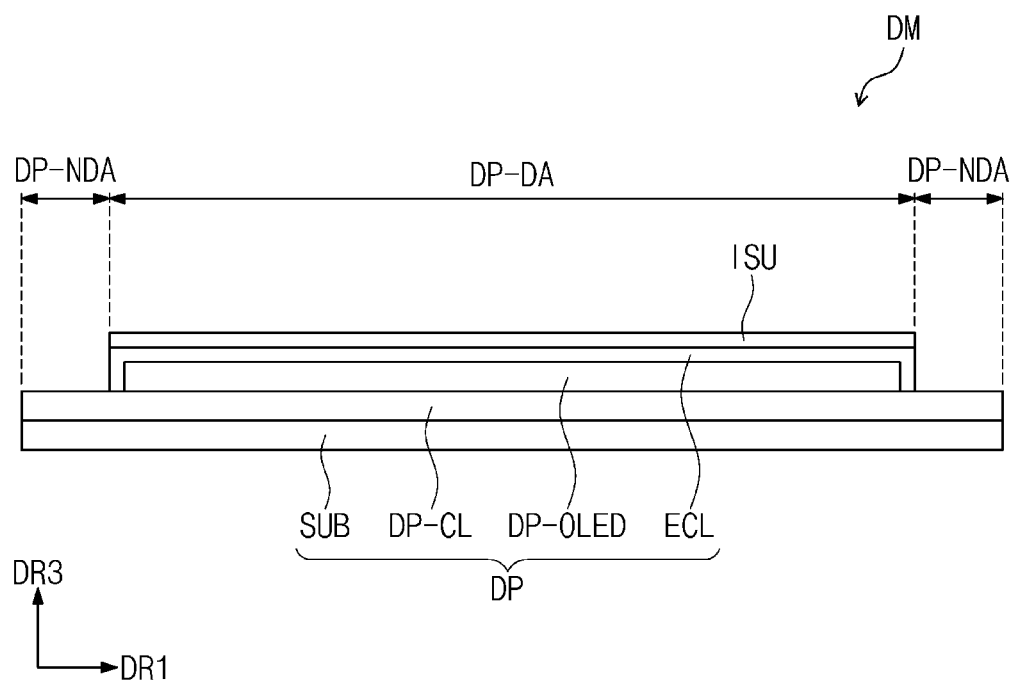
FIG. 2 is a cross-sectional view of a display module constructed according to an embodiment of the inventive concept.

FIG. 2 is a cross-sectional view of a display module according to an embodiment of the inventive concept. The display device DD according to an embodiment of the inventive concept may include display module DM.

Referring to FIG. 2, a display module DM may include the display panel DP and an input sensing layer ISU.

According to an embodiment of the inventive concept, the display panel DP may be a light emitting display panel, and the type thereof is not particularly limited. For example, the display panel DP may be an organic light emitting display panel or a quantum dot light emitting display panel. A light emitting layer of an organic light emitting display panel may include an organic light emitting material. A light emitting layer of a quantum dot light emitting display panel may include a quantum dot, a quantum rod, and the like. Hereinafter, the display panel DP is described as the organic light emitting display panel.

The display panel DP includes a base substrate SUB, a circuit element layer DP-CL, a display element layer DP-OLED, and an encapsulation layer ECL. The display panel DP includes a display region DP-DA and a non-display region DP-NDA. The display region DP-DA and the non-display region DP-NDA of the display panel DP may respectively overlap the display region DD-DA and the non-display region DD-NDA of the display device DD described above with reference to FIG. 1A. The non-display region DP-NDA may be adjacent to one side of the display region DP-DA or may be omitted.

The base substrate SUB generally supports the components of the display panel DP and the input sensing layer ISU, and may include a flexible material. For example, the base substrate SUB may include a plastic substrate, a glass substrate, or an organic/inorganic composite substrate. Alternatively, the base substrate SUB may be a laminated structure including a plurality of insulating layers. The plastic substrate may include at least one of acrylic resin, methacrylic resin, polyisoprene, vinyl resin, epoxy resin, urethane resin, cellulose resin, siloxane resin, polyimide resin, polyamide resin, or perylene resin.

The circuit element layer DP-CL may include a plurality of insulating layers, a plurality of conductive layers, and a semiconductor layer. The plurality of conductive layers of the circuit element layer DP-CL may constitute signal lines, or a pixel drive circuit for each of pixels. The pixel drive circuit may be provided in plurality.

The display element layer DP-OLED overlaps the display region DP-DA and is disposed on the base substrate SUB. The display element layer DP-OLED includes display elements, for example, organic light emitting elements. However, the display element layer DP-OLED is not limited thereto, and may include inorganic light emitting diodes or organic-inorganic hybrid light emitting diodes, depending on the type of display panel DP.

The encapsulation layer ECL seals the display element layer DP-OLED. For example, the encapsulation layer ECL may overlap both the display region DP-DA and the non-display region DP-NDA, or may not overlap the non-display region DP-NDA.

According to an embodiment, the encapsulation layer ECL may be provided as a thin film encapsulation layer, and includes at least one insulating layer. The encapsulation layer ECL according to an embodiment of the inventive concept may include at least one encapsulation organic film and at least one encapsulation inorganic film.

The encapsulation inorganic film protects the display element layer DP-OLED from moisture/oxygen, and the encapsulation organic film protects the display element layer DP-OLED from foreign matter such as dust particles. The encapsulation inorganic film may include a silicon nitride layer, a silicon oxynitride layer, a silicon oxide layer, a titanium oxide layer, an aluminum oxide layer, or the like, but is not particularly limited thereto. The encapsulation organic film may include an acrylic organic film and is not particularly limited.

The input sensing layer ISU senses an input applied from the outside. The input applied from the outside may be provided in various forms. For example, the input from the outside includes various forms of external inputs such as a part of a user's body, a stylus pen, light, heat and pressure. Further, a spatial touch (e.g., hovering) meaning that a part of a user's body such as the user's hand is close or adjacent to the input sensing layer ISU may also be one form of the input from the outside, in addition to an input that a part of the user's body contacts the input sensing layer ISU.

According to an embodiment of the inventive concept, the input sensing layer ISU may be disposed directly on the display panel DP. In this specification, the description "A component A is disposed directly on a component B." means that an adhesive layer is not disposed between the component A and the component B. The input sensing layer ISU may be manufactured by a continuous process together with the display panel DP. That is, the input sensing layer ISU may be formed directly on the encapsulation layer ECL by the continuous process.

Figure 3:
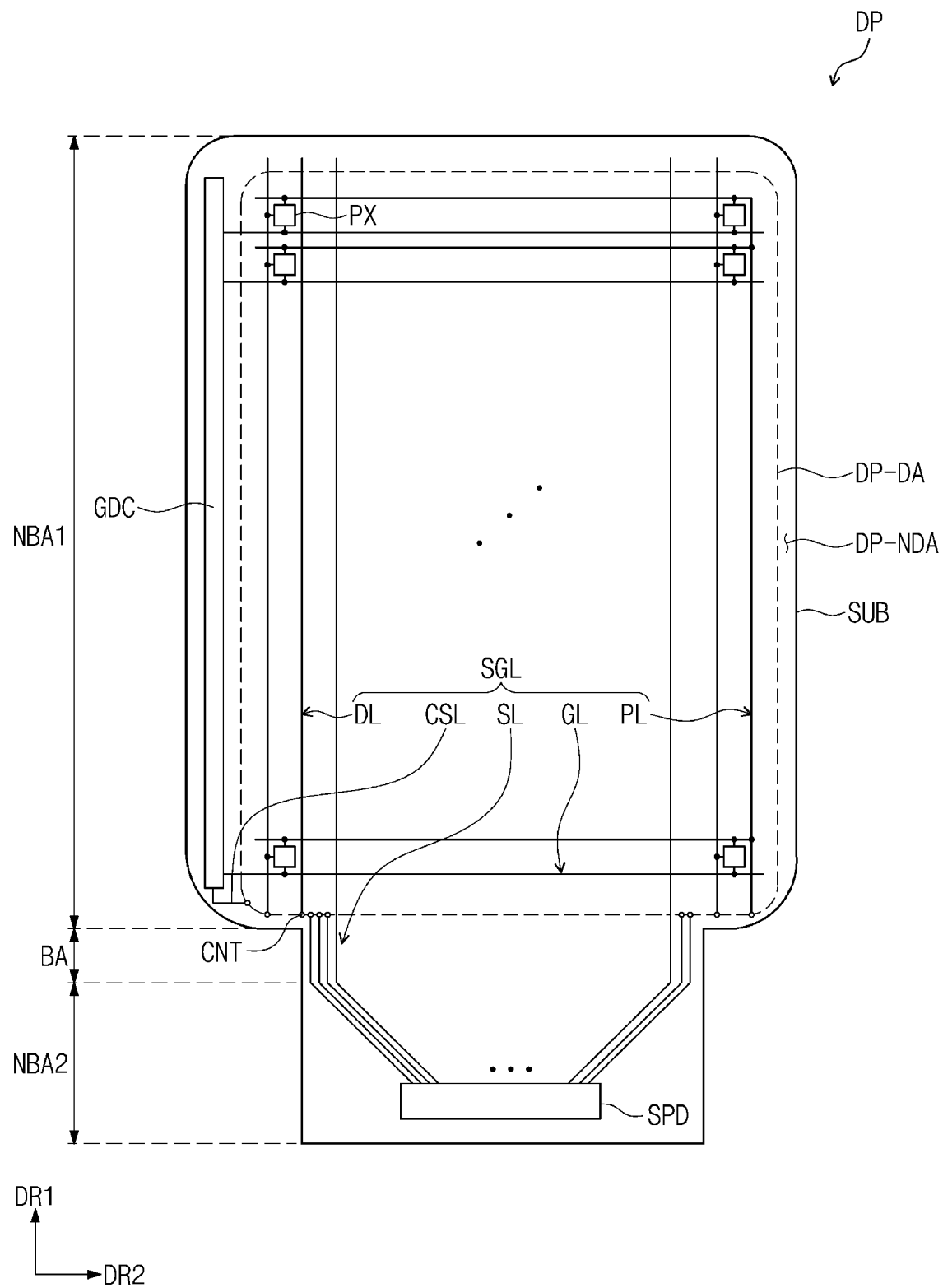
FIG. 3 is a plan view of a display panel constructed according to an embodiment of the inventive concept.

FIG. 3 is a plan view of the display panel according to an embodiment of the inventive concept.

Referring to FIG. 3, the display panel DP may include a drive circuit GDC, a group SGL including a plurality of signal lines (hereinafter, referred to as a signal line group SGL), a drive chip SPD, and a plurality of pixels PX. The pixels PX are arranged in the display region DP-DA. Each of the pixels PX may include an organic light emitting diode and the pixel drive circuit connected thereto. The drive circuit GDC, the signal line group SGL, the drive chip SPD, and the pixel drive circuit may be included in the circuit element layer DP-CL illustrated in FIG. 2.

According to an embodiment of the inventive concept, the pixels PX of the display panel DP and the drive circuit GDC of the circuit element layer DP-CL overlap the first non-bent region NBA1. The signal line group SGL may overlap each of the first non-bent region NBA1, the second non-bent region NBA2, and the bent region BA.

The drive circuit GDC generates a plurality of scan signals (hereinafter, referred to as scan signals) and sequentially outputs the scan signals to a plurality of scan lines GL (hereinafter, referred to as scan lines GL) to be described later. The drive circuit GDC may further output another control signal to the pixel drive circuits of the pixels PX.

The drive circuit GDC may include a plurality of thin film transistors formed through a process the same as that for the pixel drive circuits of the pixels PX, for example, a low temperature polycrystalline silicon (LTPS) process or a low temperature polycrystalline oxide (LTPO) process.

The signal line group SGL overlaps the display region DP-DA and the non-display region DP-NDA. The signal line group SGL includes the scan lines GL, data lines DL, a power line PL, a control signal line CSL, and pad lines SL. Each of the scan lines GL is connected to corresponding pixels PX of the pixels PX, and each of the data lines DL is connected to corresponding pixels PX of the pixels PX. The power line PL is connected to the pixels PX. The control signal line CSL may provide control signals to a scan drive circuit. The drive chip SPD is electrically connected to the pad lines SL, and outputs drive signals necessary for the operation of the display panel DP to the pad lines SL.

Each of first pad lines of the pad lines SL is electrically connected to a corresponding data line DL of the data lines DL. A second pad line of the pad lines SL is electrically connected to the control signal line CSL. A third pad line of the pad lines SL is electrically connected to the power line PL. Hereinafter in this specification, the data lines DL, the control signal line CSL, and the power line PL may be collectively referred to as drive lines. Each of the pad lines SL includes one end electrically connected to the drive chip SPD and the other end electrically connected to one corresponding drive line of the drive lines.

According to FIG. 3, the other end of each of the pad lines SL is illustrated as overlapping only the non-display region DP-NDA, but an embodiment of the inventive concept is not limited thereto and a portion of each of the pad lines SL may overlap the display region DP-DA.

Each of first data lines of the data lines DL may be electrically connected to a corresponding first line of the pad lines SL. In this specification, the first data line and the corresponding first line may be defined as a first signal line. The corresponding first line electrically connected to the drive chip SPD is defined as a first sub line, and the first data line corresponding thereto overlapping the display region DP-DA is defined as a second sub line.

According to an embodiment of the inventive concept, the first sub line and the second sub line may be electrically connected to each other through a first connection line, rather than being directly connected to each other. Each of the first sub line, the second sub line, and the first connection line may be provided in plurality. For example, the first connection line may overlap the display region DP-DA and connect the first sub line to the second sub line through a contact hole CNT. Also, the first sub line and the second sub line may be spaced apart from each other when viewed in a plane.

A second data line of the data lines DL may be electrically connected to a corresponding second line of the pad lines SL. In this specification, the second data line and the second line may be defined as a central signal line. The first signal line may be disposed more outwardly in the second direction DR2 than the central signal line.

In particular, the second data line and the second line may be directly connected to each other. For example, the second data line and the second line may be provided in an integral shape formed through a single process.

The control signal line CSL may be electrically connected to a corresponding second pad line of the pad lines SL. In this specification, the control signal line CSL and the second pad line may be defined as a second signal line. The second pad line electrically connected to the drive chip SPD is defined as a third sub line, and the control signal line CSL electrically connected to the drive circuit GDC is defined as a fourth sub line.

According to an embodiment of the inventive concept, the third sub line and the fourth sub line may be electrically connected to each other through a second connection line, rather than being directly connected to each other. For example, the second connection line may overlap the display region DP-DA and connect the third sub line to the fourth sub line through the contact hole CNT.

Similarly, the power line PL may also have the same structure as the control signal line described in detail above. For example, the power line PL may also be electrically connected to a corresponding pad line of the pad lines SL through the contact hole CNT.

Meanwhile, a connection structure between the pad lines SL and the drive lines will be described in more detail with reference to FIG. 6.

Figure 4A:
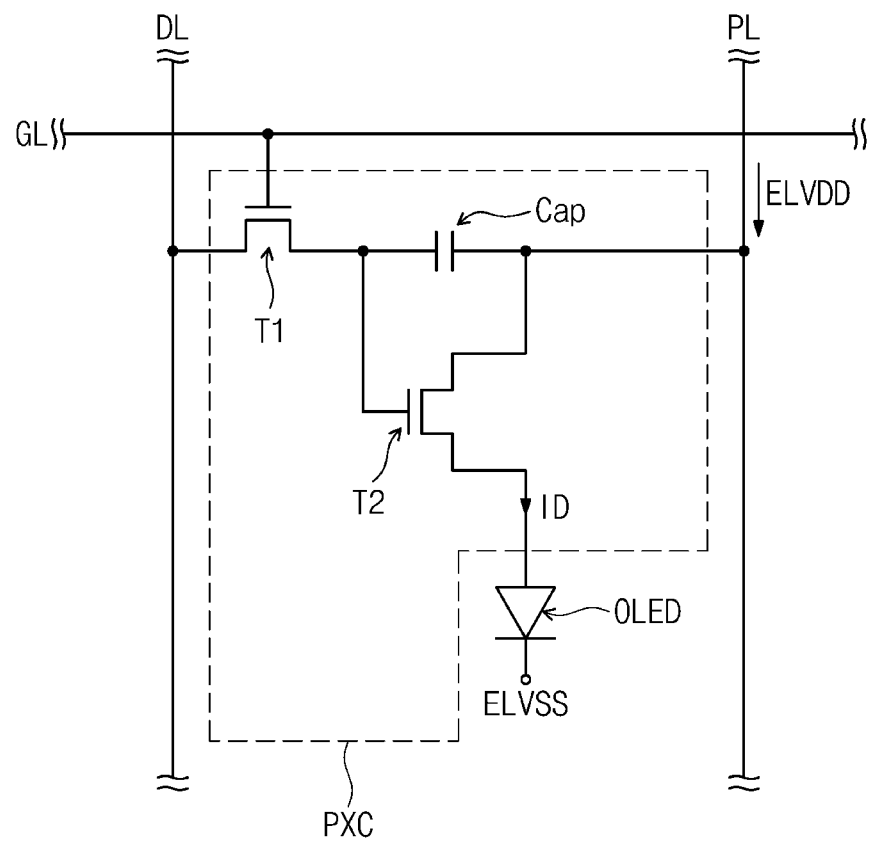
FIG. 4A is an equivalent circuit diagram of a pixel included in the display panel constructed according to an embodiment of the inventive concept.
Figure 4B:
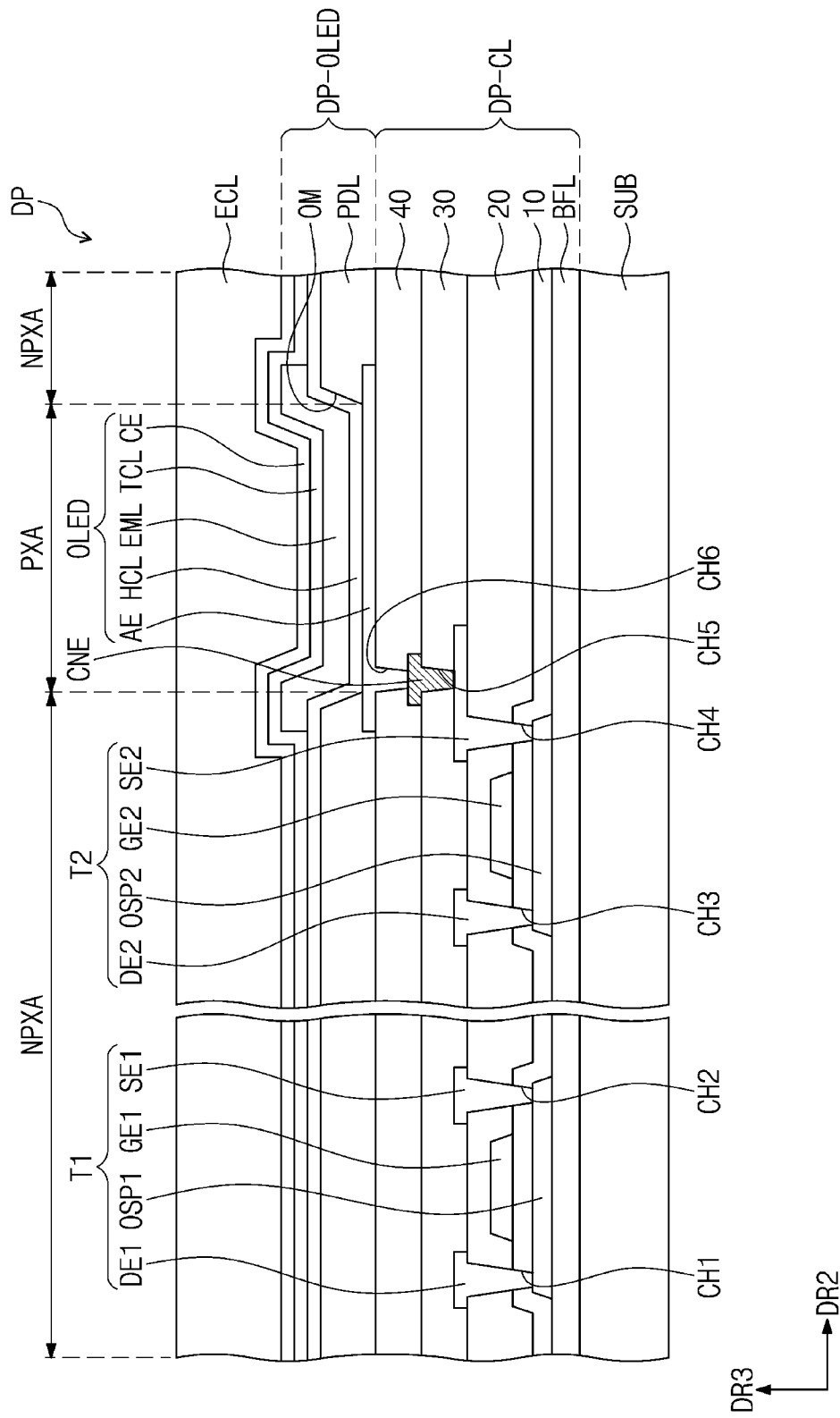
FIG. 4B is a cross-sectional view illustrating a portion of the display panel constructed according to an embodiment of the inventive concept.

FIG. 4A is an equivalent circuit diagram of the pixel included in the display panel according to an embodiment of the inventive concept. FIG. 4B is a cross-sectional view illustrating a portion of the display panel according to an embodiment of the inventive concept.

Referring to FIG. 4A, the pixel PX that is connected to one scan line GL of the scan lines GL, one data line DL of the data lines DL, and the power line PL is illustrated by way of example. However, the technical spirit of an embodiment of the inventive concept is not limited thereto, and the configuration of the pixel PX may be variously modified to be implemented.

The pixel PX includes a light emitting element OLED and a pixel drive circuit PXC. The light emitting element OLED may be included in the display element layer DP-OLED illustrated in FIG. 2. The light emitting element OLED may be a top emission type diode or a bottom emission type diode.

The pixel drive circuit PXC is a circuit part for driving the light emitting element OLED, and includes a first transistor T1 (or a switching transistor T1), a second transistor T2 (or a drive transistor T2), and a capacitor Cap. The pixel drive circuit PXC may be included in the circuit element layer DP-CL illustrated in FIG. 2.

In the light emitting element OLED, light is generated by an electrical signal provided from the first and second transistors T1 and T2.

The first transistor T1 outputs, in response to a scan signal applied to the one scan line GL, a data signal applied to the one data line DL. The capacitor Cap is charged up to a voltage corresponding to the data signal received from the first transistor T1. A first power supply voltage ELVDD is provided to a first electrode AE through the second transistor T2, and a second power supply voltage ELVSS is provided to a second electrode CE. The second power supply voltage ELVSS may be lower than the first power supply voltage ELVDD. {{{??? No AE/CE in FIG. 4A, either add in FIG. 4A or delete them from spec ???}}}

The second transistor T2 is electrically connected to the light emitting element OLED through the first electrode AE. The second transistor T2 controls a drive current ID flowing into the light emitting element OLED in response to a quantity of electric charge stored in the capacitor Cap. The light emitting element OLED emits light during a turn-on period of the second transistor T2.

FIG. 4B illustrates a cross section of a portion of the display panel DP corresponding to the equivalent circuit illustrated in FIG. 4A. The circuit element layer DP-CL, the display element layer DP-OLED, and the encapsulation layer ECL are sequentially disposed on the base substrate SUB.

The circuit element layer DP-CL includes at least one insulating layer of the insulating layers and a circuit element. The circuit element includes the signal lines, the pixel drive circuit, or the like. The circuit element layer DP-CL may be formed through a process of forming the insulating layer, the semiconductor layer, and each of the conductive layers by coating, deposition or the like, and a patterning process of the insulating layer, the semiconductor layer, and the conductive layer by a photolithography process.

The circuit element layer DP-CL may include a buffer film BFL, a first intermediate inorganic film 10, and a second intermediate inorganic film 20 that are inorganic films, and a first intermediate organic film 30 and a second intermediate organic film 40 that are organic films. The buffer film BFL may include a plurality of laminated inorganic films. FIG. 4B exemplarily illustrates a disposition relation between a first semiconductor pattern OSP1, a second semiconductor pattern OSP2, a first control electrode GE1, a second control electrode GE2, a first input electrode DE1, a first output electrode SE1, a second input electrode DE2, and a second output electrode SE2 that constitute the switching transistor T1 and the drive transistor T2. First to fourth through-holes CH1, CH2, CH3, and CH4 are also illustrated by way of example.

The first semiconductor pattern OSP1 and the second semiconductor pattern OSP2 are disposed on the buffer film BFL. The first intermediate inorganic film 10 covers the first semiconductor pattern OSP1 and the second semiconductor pattern OSP2 and is disposed on the buffer film BFL.

The first control electrode GE1 and the second control electrode GE2 are disposed on the first intermediate inorganic film 10. The first control electrode GE1 overlaps the first semiconductor pattern OSP1 and the second control electrode GE2 overlaps the second semiconductor pattern OSP2.

The second intermediate inorganic film 20 covers the first control electrode GE1 and the second control electrode GE2, and is disposed on the first intermediate inorganic film 10. The first input electrode DE1, the first output electrode SE1, the second input electrode DE2, and the second output electrode SE2 are disposed on the second intermediate inorganic film 20. The first input electrode DE1 and the first output electrode SE1 may be electrically connected to the first semiconductor pattern OSP1 through the first through-hole CH1 and the second through-hole CH2, respectively, which pass through the first intermediate inorganic film 10 and the second intermediate inorganic film 20. The second input electrode DE2 and the second output electrode SE2 may be electrically connected to the second semiconductor pattern OSP2 through the third through-hole CH3 and the fourth through-hole CH4, respectively, which pass through the first intermediate inorganic film 10 and the second intermediate inorganic film 20.

The first intermediate organic film 30 covers the first input electrode DE1, the first output electrode SE1, the second input electrode DE2, and the second output electrode SE2, and is disposed on the second intermediate inorganic film 20. A connection electrode CNE may be disposed on the first intermediate organic film 30. The connection electrode CNE may be electrically connected to the second output electrode SE2 through a fifth through-hole CH5 penetrating the first intermediate organic film 30. The second intermediate organic film 40 covers the connection electrode CNE and is disposed on the first intermediate organic film 30. The first intermediate organic film 30 and the second intermediate organic film 40 may be formed as a planarization layer.

The display element layer DP-OLED includes the light emitting element OLED and a pixel defining layer PDL. The light emitting element OLED includes the first electrode AE, a hole control layer HCL, a light emitting layer EML, an electron control layer TCL, and the second electrode CE. The pixel defining layer PDL is provided as an organic layer and includes an opening OM. The opening OM may be provided in plurality. The opening OM of the pixel defining layer PDL exposes at least a portion of the first electrode AE.

When described in detail, the first electrode AE is disposed on the second intermediate organic film 40. The first electrode AE is electrically connected to the connection electrode CNE and the second output electrode SE2 through a sixth through-hole CH6 penetrating the second intermediate organic film 40.

The display region DP-DA of the display panel DP may include a pixel region PXA and a light shielding region NPXA adjacent to the pixel region PXA. The pixel region PXA may be provided in plurality. The pixel region PXA may mean a region that actually emits light to the outside, that is, a region where an image is formed. The display element layer DP-OLED overlapping the display region DP-DA may include the plurality of pixel regions PXA and the light shielding region NPXA adjacent thereto. For example, the light shielding region NPXA may surround the pixel regions PXA when viewed in a plane.

The hole control layer HCL may be disposed in both the pixel regions PXA and the light shielding region NPXA. The hole control layer HCL may include a hole transport layer, and may further include a hole injection layer. The light emitting layer EML is disposed on the hole control layer HCL. The light emitting layer EML may be disposed in a region corresponding to the opening OM that emits light. Accordingly, the light emitting layer EML may be formed separately in each of the pixels. The light emitting layer EML may include an organic material and/or an inorganic material. The light emitting layer EML may generate predetermined colored light.

The electron control layer TCL is disposed on the light emitting layer EML. The electron control layer TCL may include an electron transport layer, and may further include an electron injection layer. The hole control layer HCL and the electron control layer TCL may be formed in common in the plurality of pixels by using an open mask. The second electrode CE is disposed on the electron control layer TCL. The second electrode CE has an integral shape and disposed in common on the electron control layer TCL included in each of the plurality of pixels.

The encapsulation layer ECL is disposed on the second electrode CE. The encapsulation layer ECL may be provided as a single encapsulation layer or a plurality of thin films.

Figure 5A:
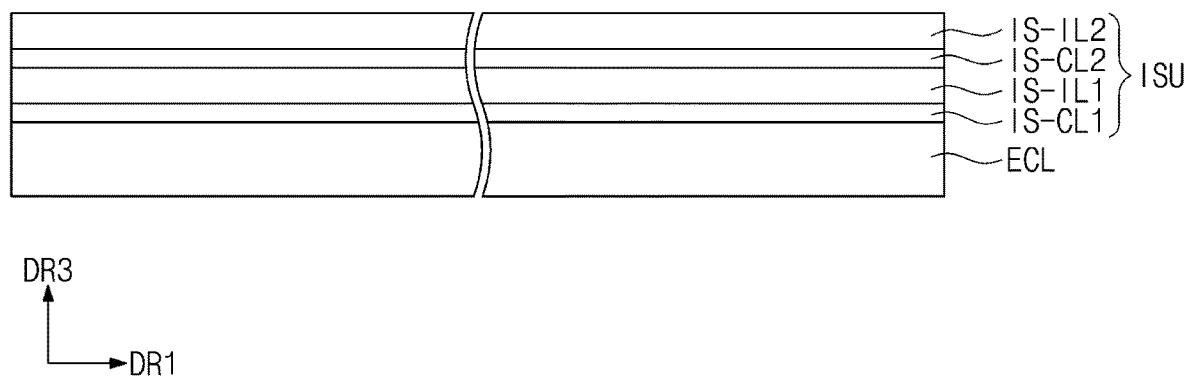
FIG. 5A is a cross-sectional view of an input sensing layer constructed according to an embodiment of the inventive concept.
Figure 5B:
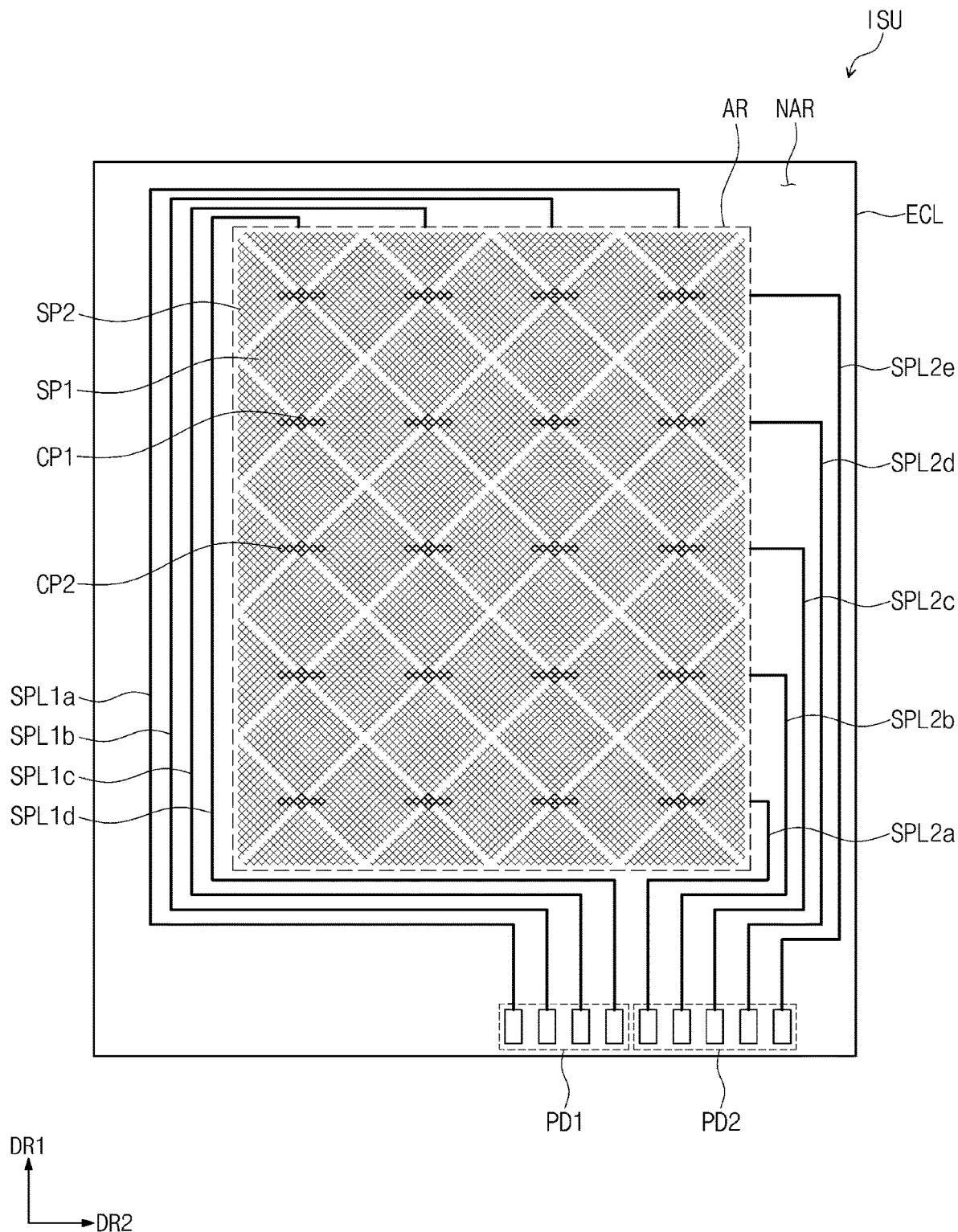
FIG. 5B is a plan view of the input sensing layer constructed according to an embodiment of the inventive concept.
Figure 5C:
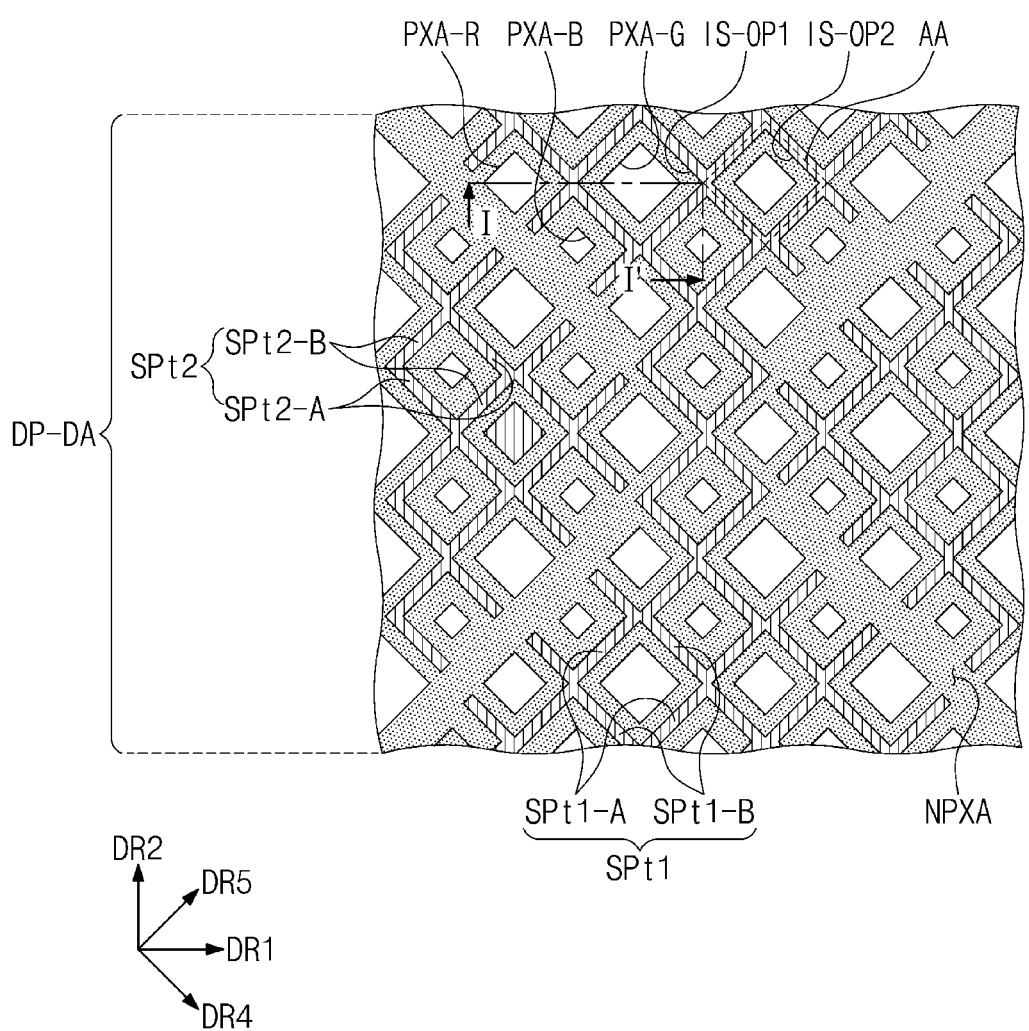
FIG. 5C is an enlarged view of a portion of the input sensing layer illustrated in FIG. 5B, constructed according to an embodiment of the inventive concept.
Figure 5D:
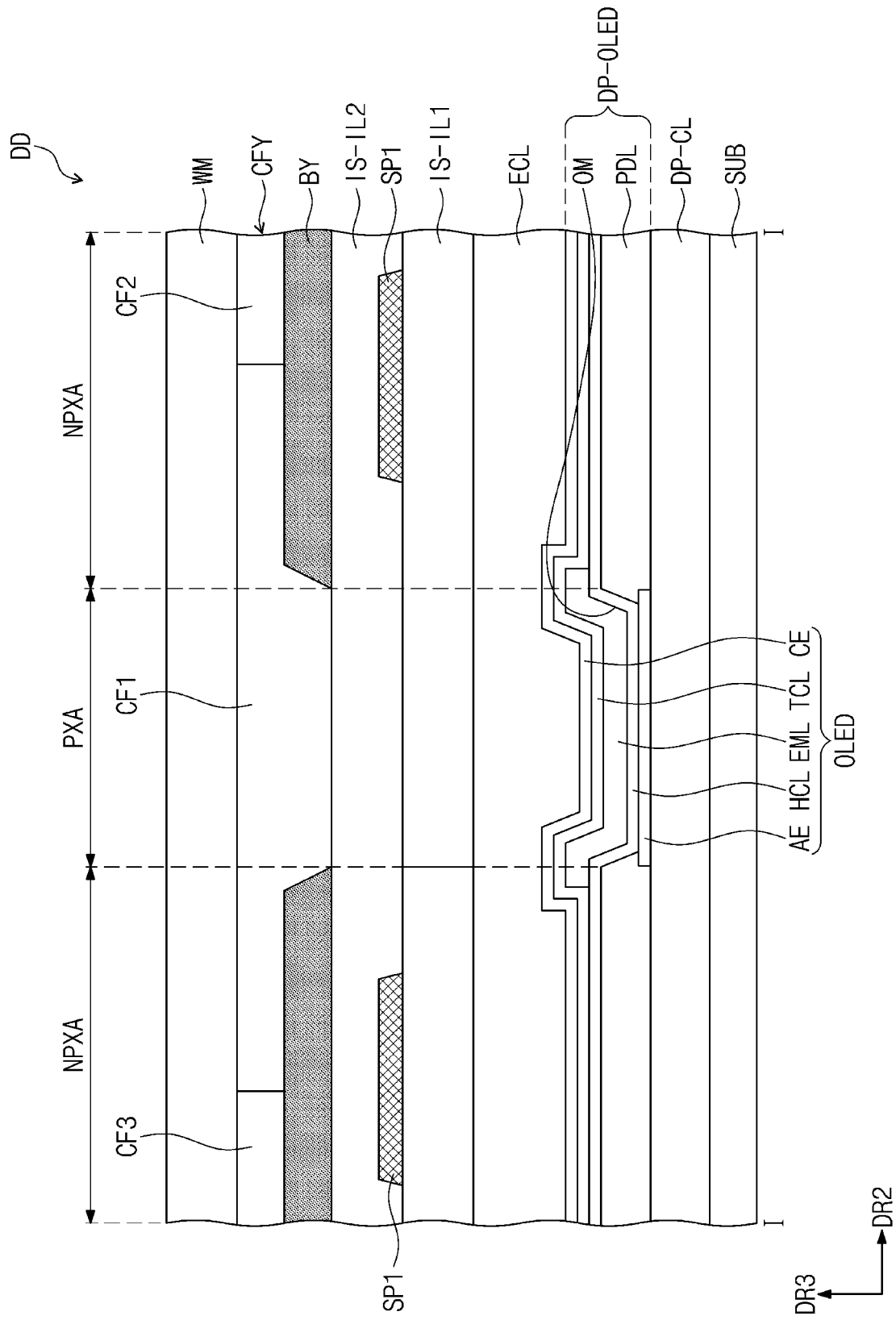
FIG. 5D is a cross-sectional view of the display device taken along line I-I' illustrated in FIG. 5C, constructed according to an embodiment of the inventive concept.

FIG. 5A is a cross-sectional view of the input sensing layer according to an embodiment of the inventive concept. FIG. 5B is a plan view of the input sensing layer according to an embodiment of the inventive concept. FIG. 5C is an enlarged view of a portion of the input sensing layer illustrated in FIG. 5B, according to an embodiment of the inventive concept. FIG. 5D is a cross-sectional view of the display device taken along line I-I' illustrated in FIG. 5C, according to an embodiment of the inventive concept.

Referring to FIG. 5A, the input sensing layer ISU includes a first conductive layer IS-CL1, a first input insulating layer IS-IL1, a second conductive layer IS-CL2, and a second input insulating layer IS-IL2 disposed on the encapsulation layer ECL. The first conductive layer IS-CL1 is disposed directly on the encapsulation layer ECL.

Each of the first conductive layer IS-CL1 and the second conductive layer IS-CL2 may have a single layer structure, or a multilayer structure laminated in the third direction DR3. A conductive layer of the multilayer structure may include at least two of transparent conductive layers and metal layers. The conductive layer of the multilayer structure may include metal layers including metals different from each other. Each of the transparent conductive layers may include indium tin oxide (ITO), indium zinc oxide (IZO), zinc oxide (ZnO), indium tin zinc oxide (ITZO), PEDOT, metal nanowire, or graphene. Each of the metal layers may include molybdenum, silver, titanium, copper, aluminum, or an alloy thereof. For example, each of the first conductive layer IS-CL1 and the second conductive layer IS-CL2 may have a metal layer structure of three layers, for example, a three layer structure of titanium/aluminum/titanium.

Each of the first conductive layer IS-CL1 and the second conductive layer IS-CL2 includes a plurality of conductive patterns. Hereinafter, the first conductive layer IS-CL1 is described as including first conductive patterns, and the second conductive layer IS-CL2 is described as including second conductive patterns. According to an embodiment of the inventive concept, conductive patterns disposed on the same layer may be formed through the same process, may include the same material, and may have the same laminated structure.

For example, the first conductive patterns may include second connection patterns, and the second conductive patterns may include sensing patterns, sensing signal lines connected thereto, and first connection patterns. The sensing patterns may be provided in a mesh shape overlapping the light shielding region NPXA and not overlapping the pixel region PXA of FIG. 4B. Alternatively, the sensing patterns may be provided as transparent patterns overlapping the pixel region PXA and the light shielding region NPXA.

Each of the first input insulating layer IS-IL1 and the second input insulating layer IS-IL2 may include an inorganic material or an organic material. According to an embodiment of the inventive concept, the first input insulating layer IS-IL1 and the second input insulating layer IS-IL2 may each be an organic film including an organic material. The organic film may include at least one of acrylic resin, methacrylic resin, polyisoprene, vinyl resin, epoxy resin, urethane resin, cellulose resin, siloxane resin, polyimide resin, polyamide resin, or perylene resin.

However, an embodiment of the inventive concept is not limited thereto, and each of the first input insulating layer IS-IL1 and the second input insulating layer IS-IL2 may be provided as an inorganic film including an inorganic material. In this case, the inorganic film may include at least one of aluminum oxide, titanium oxide, silicon oxide, silicon oxynitride, zirconium oxide, or hafnium oxide.

According to an embodiment of the inventive concept, the input sensing layer ISU may sense an external input by a capacitive method. For example, the input sensing layer ISU may calculate coordinate information of an external input on the basis of changed capacitance between the second conductive patterns included in the second conductive layer IS-CL2. However, an embodiment of the inventive concept is not limited thereto, and the input sensing layer ISU may sense an external input by a pressure sensing method.

Referring to FIG. 5B, the input sensing layer ISU includes a plurality of first sensing parts, a plurality of second sensing parts, a plurality of sensing signal lines, a first pad group PD1, and a second pad group PD2.

The input sensing layer ISU includes an active region AR and an inactive region NAR adjacent to the active region AR. The active region AR may correspond to the display region DP-DA illustrated in FIG. 3, and the inactive region NAR may correspond to the non-display region DP-NDA illustrated in FIG. 3. In addition, the input sensing layer ISU according to an embodiment of the inventive concept is described as being disposed directly on the encapsulation layer ECL.

The first sensing parts and the second sensing parts are arranged in the active region AR. The plurality of sensing signal lines, the first pad group PD1, and the second pad group PD2 are arranged in the inactive region NAR.

The first sensing parts may have a shape in which the first sensing parts are arranged in the second direction DR2 and each of the first sensing parts extend in the first direction DR1. Each of the first sensing parts may include a plurality of first sensing patterns SP1 and a plurality of first connection patterns CP1 connecting the first sensing patterns SP1.

Each of the first sensing patterns SP1 and the first connection patterns CP1 may have a mesh shape in which a plurality of mesh openings are defined. The first sensing patterns SP1 and the first connection patterns CP1 are arranged in the second direction DR2. Each of the first connection patterns CP1 connects two adjacent first sensing patterns SP1 among the first sensing patterns SP1.

The second sensing parts may have a shape in which each of the second sensing parts are arranged in the second direction DR2 and the second sensing parts extend in the first direction DR1. Each of the second sensing parts may include a plurality of second sensing patterns SP2 and a plurality of second connection patterns CP2 connecting the second sensing patterns SP2.

Each of the second sensing patterns SP2 and the second connection patterns CP2 may have a mesh shape in which a plurality of mesh openings are defined. The second sensing patterns SP2 and the second connection patterns CP2 are arranged in the first direction DR1. Each of the second connection patterns CP2 connects two adjacent second sensing patterns SP2 among the second sensing patterns SP2.

For example, the second connection patterns CP2 and the second sensing patterns SP2 may be disposed on different layers, for example, at least one input insulating layer may be disposed between the second connection patterns CP2 and the second sensing patterns SP2. In addition, the second connection patterns CP2 may be electrically connected to the second sensing patterns SP2 respectively, through contact holes included in the input insulating layer.

Meanwhile, according to an embodiment of the inventive concept, the second connection patterns CP2 may be included in the first conductive layer IS-CL1 and may be described, hereinafter, as the first conductive patterns. The first sensing patterns SP1, the second sensing patterns SP2, and the first connection patterns CP1 may be included in the second conductive layer IS-CL2 and may be described, hereinafter, as the second conductive patterns. However, an embodiment of the inventive concept is not limited thereto, and positions of the first conductive layer IS-CL1 and the second conductive layer IS-CL2 may be changed into the positions of each other.

The plurality of sensing signal lines include first sensing signal lines SPL1a to SPL1d and second sensing signal lines SPL2a to SPL2e. One ends of the first sensing signal lines SPL1a to SPL1d are respectively connected to the first sensing patterns SP1, and the other ends of the first sensing signal lines SPL1a to SPL1d are respectively connected to pads included in the first pad group PD1. The first sensing signal lines SPL1a to SPL1d transmit, to the first pad group PD1, signals from the first sensing patterns SP1.

One ends of the second sensing signal lines SPL2a to SPL2e are respectively connected to the second sensing patterns SP2. The other ends of the second sensing signal lines SPL2a to SPL2e are respectively connected to pads included in the second pad group PD2. The second sensing signal lines SPL2a to SPL2e transmit, to the second pad group PD2, signals from the second sensing patterns SP2.

Although not illustrated, the shape of the first sensing signal lines SPL1a to SPL1d and the second sensing signal lines SPL2a to SPL2e may also be provided as a mesh shape.

Referring to FIG. 5C, as described with reference to FIG. 4B, the display region DP-DA includes a plurality of pixel regions PXA-R, PXA-G, and PXA-B, and the light shielding region NPXA adjacent to the pixel regions PXA-R, PXA-G, and PXA-B. The pixel regions PXA-R, PXA-G, and PXA-B may respectively overlap the openings OM defined in the pixel defining layer PDL.

The first sensing patterns SP1 include first mesh lines SPt1 that define the mesh openings. Although the first mesh lines SPt1 are described as defining the mesh openings, at least some of the first mesh lines SPt1 may not define a mesh opening. For example, some of the first mesh lines SPt1 adjacent to the edge of one of the first sensing patterns SP1 may not define a mesh opening.

The second sensing patterns SP2 include second mesh lines SPt2 that define the mesh openings. Similarly, although the second mesh lines SPt2 are described as defining the mesh openings, at least some of the second mesh lines SPt2 may not define a mesh opening. For example, some of the second mesh lines SPt2 adjacent to the edge of one of the second sensing patterns SP2 may not define a mesh opening.

According to an embodiment of the inventive concept, the area of each of the mesh openings may be larger than the area of any one of the pixel regions.

In addition, each of the first mesh lines SPt1 and the second mesh lines SPt2 overlaps the light shielding region NPXA. Each of the first mesh lines SPt1 includes two first extending portions SPt1-A extending in a fifth direction DR5 crossing the first direction DR1 and the second direction DR2 and two second extending portions SPt1-B extending in a fourth direction DR4 crossing the fifth direction DR5. The first extending portions SPt1-A may face each other and may be connected to the second extending portions SPt1-B. The second extending portions SPt1-B may face each other and may be connected to the first extending portions SPt1-A. The line width of each of the mesh lines may be several microns.

Each of the second mesh lines SPt2 includes two third extending portions SPt2-A extending in the fourth direction DR4 crossing the first direction DR1 and the second direction DR2 and two fourth extending portions SPt2-B extending in the fifth direction DR5 crossing the fourth direction DR4. The third extending portions SPt2-A may face each other and may be connected to the fourth extending portions SPt2-B. The fourth extending portions SPt2-B may face each other and may be connected to the third extending portions SPt2-A. The line width of each of the mesh lines may be several microns.

Referring to FIG. 5D, the display device DD further includes a light shielding layer BY, a color filter layer CFY, and a window WM, in addition to the display module DM described with reference to FIG. 2.

The window WM may be disposed above the display module DM and may transmit, to the outside, an image provided from the display module DM. The window WM may be formed of glass, sapphire, plastic, or the like. In addition, although illustrated as a single layer, the window WM may include a plurality of layers. The window WM may include at least one printed layer which overlaps a base layer and the light shielding region NPXA, and is disposed on a rear surface of the base layer. The printed layer may have a predetermined color. As an example, the printed layer may be provided in a black color or in a color other than black.

The color filter layer CFY is disposed between the window WM and the input sensing layer ISU, and includes first to third color filters CF1, CF2, and CF3.

The first color filter CF1 may have a first color and overlap a first pixel region among the pixel regions PXA. The second color filter CF2 may have a second color and overlap a second pixel region among the pixel regions PXA. The third color filter CF3 may have a third color and overlap a third pixel region among the pixel regions PXA. For example, the first color may be red, the second color may be blue, and the third color may be green.

The light shielding layer BY is disposed on the second input insulating layer IS-IL2 of the input sensing layer ISU. The light shielding layer BY may include an opening corresponding to each of the pixel regions PXA. Accordingly, the pixel region PXA may be defined by the opening included in the light shielding layer BY, and the light shielding region NPXA may also be defined as a region overlapping the light shielding layer BY. As an example, the light shielding layer BY may be provided in a black color, and may divide the first to third color filters CF1, CF2, and CF3.

According to an embodiment of the inventive concept, the light shielding layer BY may have an optical density of about 1.0 to about 4.0. Hereinafter in this specification, the window WM is described as including the plurality of pixel regions PXA defined by the openings included in the light shielding layer BY, and the light shielding region NPXA overlapping the light shielding layer BY.

Meanwhile, the base substrate SUB, the circuit element layer DP-CL, the display element layer DP-OLED, and the encapsulation layer ECL of the display panel DP illustrated in FIG. 5D may have a structure substantially the same as the structure illustrated in FIG. 4B. Accordingly, a duplicate description thereof will not be given.

As described with reference to FIGS. 5A and 5B, the input sensing layer ISU includes the first conductive layer IS-CL1, the first input insulating layer IS-IL1, the second conductive layer IS-CL2, and the second input insulating layer IS-IL2. Although not illustrated in FIG. 5D, the second connection patterns CP2 included in the first conductive layer IS-CL1 may be disposed directly on the encapsulation layer ECL.

The first input insulating layer IS-IL1 may cover the second connection patterns CP2 and be disposed directly on the encapsulation layer ECL. The first input insulating layer IS-IL1 includes a bottom surface facing the encapsulation layer ECL and a top surface which is opposed to the bottom surface and on which the first sensing patterns SP1 are disposed.

The first sensing patterns SP1, the second sensing patterns SP2, and the sensing signal lines included in the second conductive layer IS-CL2 may be disposed on the top surface of the first input insulating layer IS-IL1. As example, the first sensing patterns SP1 are illustrated in FIG. 5D. Although not illustrated, the contact holes electrically connecting the second connection patterns CP2 and the second sensing patterns SP2 may be included in the first input insulating layer IS-IL1.

The second input insulating layer IS-IL2 may cover the second conductive layer IS-CL2 and be disposed on the top surface of the first input insulating layer IS-IL1. The light shielding layer BY overlapping the light shielding region NPXA may be disposed on the second input insulating layer IS-IL2.

Figure 6:
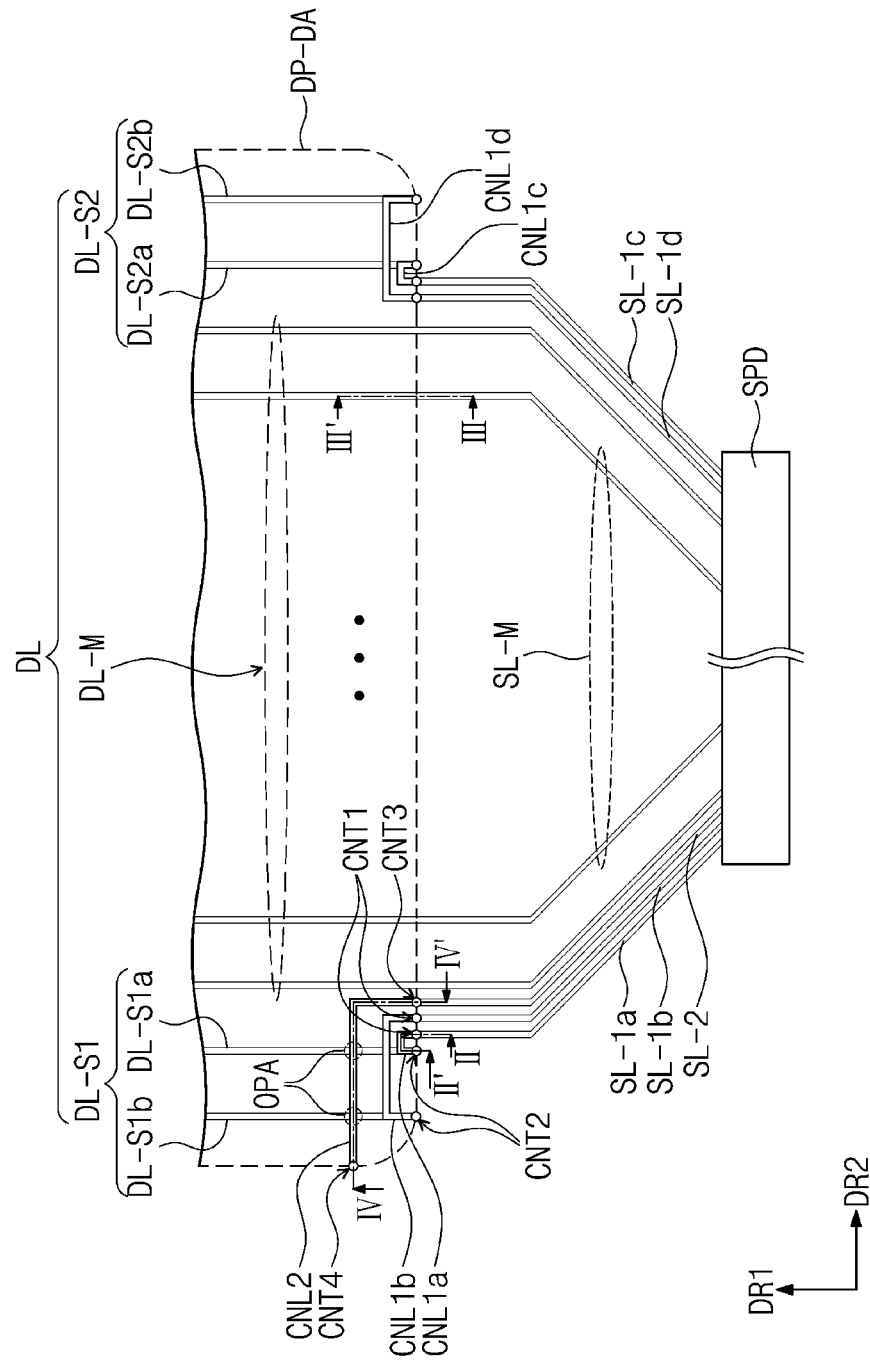
FIG. 6 is a plan view illustrating a portion of the display panel constructed according to an embodiment of the inventive concept.
Figure 7:
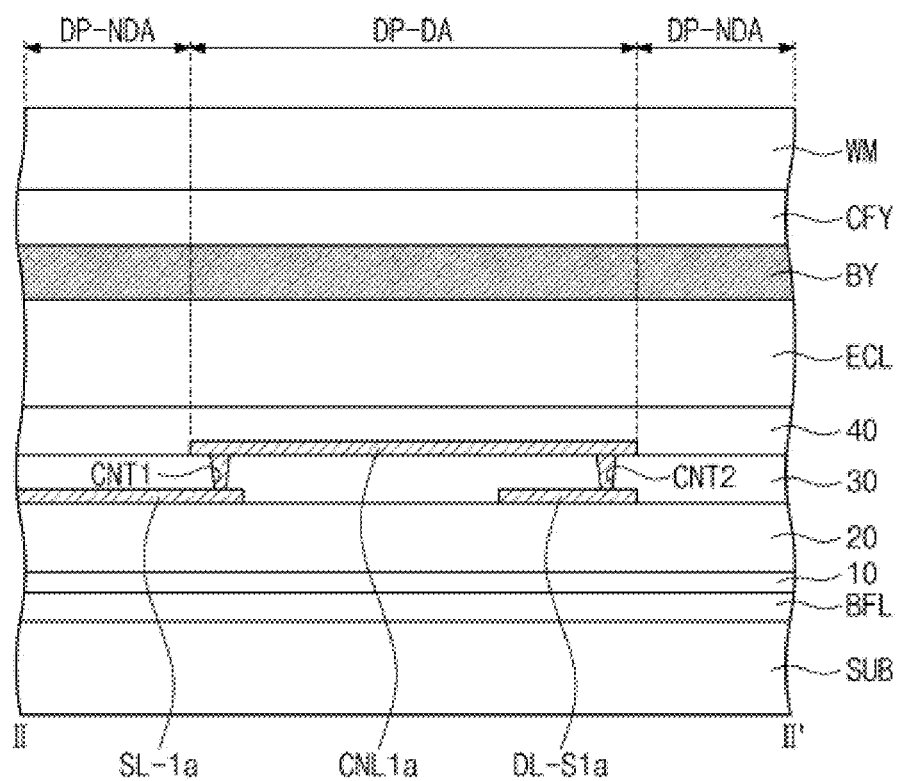
FIG. 7 is a cross-sectional view of the display device taken along line II-II' illustrated in FIG. 6, constructed according to an embodiment of the inventive concept.
Figure 8:
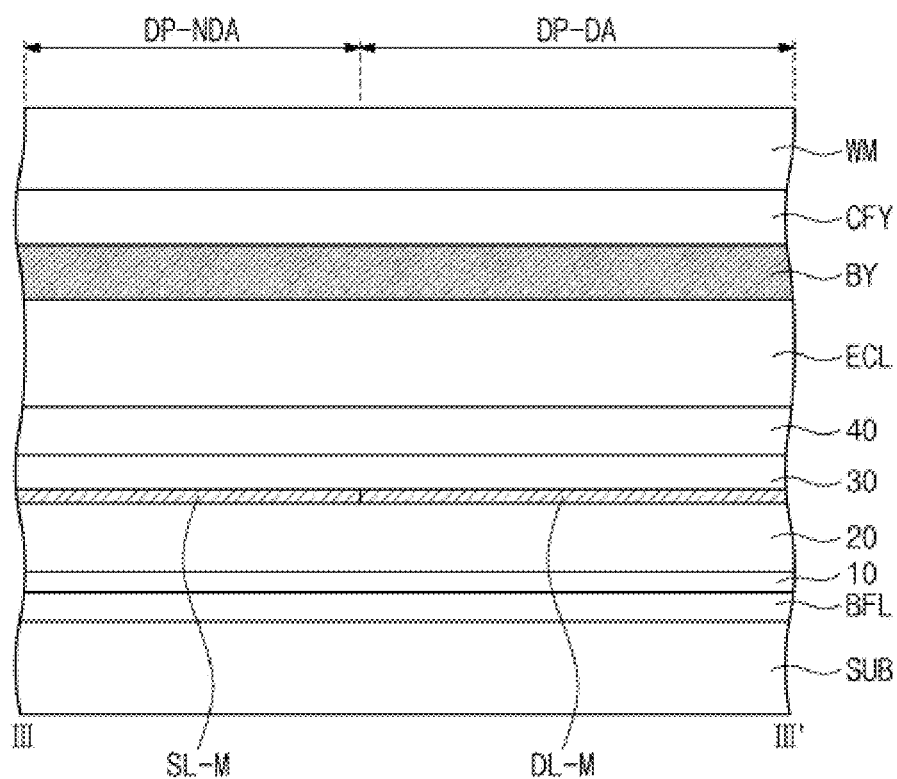
FIG. 8 is a cross-sectional view of the display device taken along line illustrated in FIG. 6, constructed according to an embodiment of the inventive concept.

FIG. 6 is a plan view illustrating a portion of the display panel according to an embodiment of the inventive concept. FIG. 7 is a cross-sectional view of the display device taken along line II-II' illustrated in FIG. 6, according to an embodiment of the inventive concept. FIG. 8 is a cross-sectional view of the display device taken along line illustrated in FIG. 6, according to an embodiment of the inventive concept.

First connection lines CNL1a, CNL1b, CNL1c, and CNL1d, and second connection line CNL2 described above with reference to FIG. 3 will be described in detail with reference to FIG. 6.

The pad lines SL include central pad lines SL-M, a first pad line group, and a second pad line group electrically connected to the drive chip SPD. When viewed in a plane, the central pad lines SL-M may be disposed between the first pad line group and the second pad line group.

When described in detail with reference to FIG. 6, each of the central pad lines SL-M is electrically connected to corresponding each of a plurality of central data lines DL-M among the data lines DL. By way of example, the central pad line SL-M and the central data line DL-M corresponding thereto are described. The central pad line SL-M and the central data line DL-M corresponding thereto may be provided in an integral shape formed through a single process. That is, as illustrated in FIG. 7, the central pad line SL-M and the central data line DL-M corresponding thereto may be in one physically connected shape. The central pad line SL-M and the central data line DL-M corresponding thereto may respectively correspond to the second pad line and the second data line of the central signal line described above with reference to FIG. 3.

The first pad line group includes a first sub pad line SL-la, a second sub pad line SL-1b, and a control pad line SL-2. The first sub pad line SL-la and the second sub pad line SL-1b may respectively correspond to the first sub lines described above with reference to FIG. 3. The control pad line SL-2 may correspond to the third sub line described above with reference to FIG. 3. Meanwhile, the number of lines included in the first pad line group is not limited thereto and may be variously changed.

According to an embodiment of the inventive concept, the control pad line SL-2 corresponding to the third sub line may be disposed between the second sub pad line SL-1b corresponding to the first sub line and the central pad lines SL-M corresponding to the central signal lines.

Hereinafter in this specification, among the first connection lines CNL1a, CNL1b, CNL1c, and CNL1d, two left connection lines CNL1a and CNL1b are defined adjacent to one side of the central data lines DL-M, and two right connection lines CNL1c and CNL1d are defined adjacent to the other side of the central data lines DL-M.

According to an embodiment of the inventive concept, the first connection lines CNL1a, CNL1b, CNL1c, and CNL1d, and the second connection line CNL2 may have a shape bent at least once when viewed in a plane.

One ends of the left connection lines CNL1a and CNL1b are electrically connected to the first sub pad line SL-la and the second sub pad line SL-1b, respectively, through first contact holes CNT1. In addition, the other ends of the left connection lines CNL1a and CNL1b are electrically connected, through second contact holes CNT2, to first and second sub data lines DL-S1a and DL-S1b, respectively, of a left data line group DL-S1 among the data lines DL. Here, the first and second sub data lines DL-S1a and DL-S1b may correspond to the second sub lines described above with reference to FIG. 3.

When described in detail with reference to FIG. 6, one end of a first sub connection line CNL1a is electrically connected to the first sub pad line SL-la through one of the two first contact holes CNT1 on the left side. The other end of the first sub connection line CNL1a is electrically connected to the first sub data line DL-S1a overlapping the display region DP-DA, through one of the two second contact holes CNT2 on the left side. In particular, the first sub pad line SL-la is spaced apart from the first sub data line DL-S1a when viewed in a plane.

Similarly, one end of a second sub connection line CNL1b having the same structure as the first sub connection line CNL1a is electrically connected to the second sub pad line SL-1b through the other of the two first contact holes CNT1 on the left side. The other end of the second sub connection line CNL1b is electrically connected to the second sub data line DL-S1b through the other of the two second contact holes CNT2 on the left side. In particular, the second sub pad line SL-1b is spaced apart from the second sub data line DL-S1b when viewed in a plane.

One end of the second connection line CNL2 is electrically connected to the control pad line SL-2 through a third contact hole CNT3. The other end of the second connection line CNL2 is electrically connected to the control signal line CSL through a fourth contact hole CNT4. Here, as described above with reference to FIG. 3, the control signal line CSL corresponds to the fourth sub line. In particular, the second connection line CNL2 may have an overlap region OPA in which the second connection line CNL2 at least partially overlaps, when viewed in a plane, the first and second sub data lines DL-S1a and DL-S1b corresponding to the second sub lines.

The structure of the right connection lines CNL1c and CNL1d may be substantially the same as the structure of the left connection lines CNL1a and CN1b. For example, one end of a third sub connection line CNL1c is electrically connected to a third sub pad line SL-1c through one of the two first contact holes CNT1 on the right side. The other end of the third sub connection line CNL1c is electrically connected to a third sub data line DL-S2a of a right data line group DL-S2 among the data lines DL through one of the two second contact holes CNT2 on the right side.

One end of a fourth sub connection line CNL1d is electrically connected to a fourth sub pad line SL-1d through the other of the two first contact holes CNT1 on the right side. The other end of the fourth sub connection line CNL1d is electrically connected to a fourth sub data line DL-S2b of the right data line group DL-S2 through the other of the two second contact holes CNT2 on the right side.

According to an embodiment of the inventive concept, the first connection lines CNL1a and CNL1b and the second connection line CNL2 may overlap the display region DP-DA. Accordingly, as the pad lines and the data lines are electrically connected through the first connection lines CNL1a and CNL1b and the second connection line CNL2 overlapping the display region DP-DA, the area of the non-display region DP-NDA may be reduced in a corner portion of the display device DD.

In other words, in the second direction DR2 of FIG. 6, one of the pad lines is connected to one outermost data line of the data lines DL through one of the connection lines overlapping the display region DP-DA described above, rather than via the non-display region DP-NDA adjacent to the corner portion of the display device DD. As a result, this embodiment may omit a region for the pad lines passing through the non-display region DP-NDA adjacent to the corner portion of the display device DD, reducing the overall area of the non-display region DP-NDA of the display device DD.

Referring to FIG. 7, the pad lines SL including the first sub pad line SL-la and the data lines DL including the first sub data line DL-S1a according to an embodiment of the inventive concept may be disposed on the second intermediate inorganic film 20 described with reference to FIG. 4B. That is, the first sub line corresponding to the first sub pad line SL-1a and the second sub line corresponding to the first sub data line DL-S1a may be disposed on the same layer.

In particular, the first sub connection line CNL1a may be disposed on the first intermediate organic film 30, and may be electrically connected to the first sub pad line SL-1a and the first sub data line DL-S1a through corresponding one of the first contact holes CNT1 and corresponding one of the second contact holes CNT2, respectively, defined in the first intermediate organic film 30. Here, the corresponding one of the first contact holes CNT1 and the corresponding one of the second contact holes CNT2 may overlap the display region DP-DA. The first sub pad line SL-1a may overlap at least a portion of the display region DP-DA.

In this specification, both the first connection lines CNL1a and CNL1b and the second connection line CNL2 may be disposed on the first intermediate organic film 30. That is, the first connection lines CNL1a and CNL1b and the second connection line CNL2 are disposed on the same layer.

In addition, according to an embodiment of the inventive concept, the first sub connection line CNL1a may overlap the light shielding layer BY. For example, the light shielding layer BY may entirely overlap the first connection lines CNL1a and CNL1b and the second connection line CNL2. Accordingly, the light shielding layer BY may block the first connection lines CNL1a and CNL1b and the second connection line CNL2 overlapping the display region DP-DA, from outside viewing.

In addition, referring to FIG. 8, it may be seen that the central pad line SL-M and the central data line DL-M corresponding thereto described with reference to FIG. 6 are formed through a single process. That is, the central pad line SL-M and the central data line DL-M corresponding thereto may have a shape in which the central pad line SL-M and the central data line DL-M corresponding thereto are connected to each other when viewed in a plane.

Figure 9:
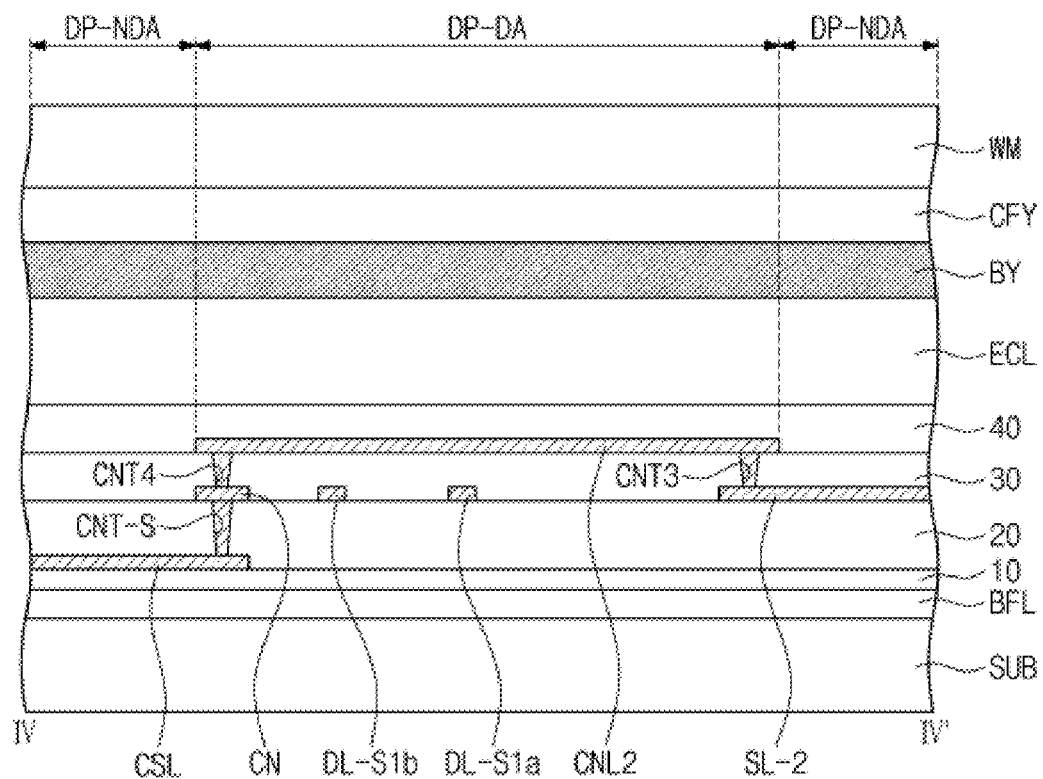
FIG. 9 is a cross-sectional view of the display device taken along line IV-IV' illustrated in FIG. 6, constructed according to an embodiment of the inventive concept.

FIG. 9 is a cross-sectional view of the display device taken along line IV-IV' illustrated in FIG. 6, according to an embodiment of the inventive concept.

Referring to FIG. 9, the second connection line CNL2 is disposed on the first intermediate organic film 30. In addition, it may be seen that the second connection line CNL2 at least partially overlaps the first and second sub data lines DL-S1a and DL-S1b. The control signal line CSL may be disposed on the first intermediate inorganic film 10 and electrically connected to an intermediate connection electrode CN through an intermediate contact hole CNT-S.

According to an embodiment of the inventive concept, one end of the second connection line CNL2 is electrically connected to the control pad line SL-2 through the third contact hole CNT3 defined in the first intermediate organic film 30. The other end of the second connection line CNL2 is electrically connected to the intermediate connection electrode CN through the fourth contact hole CNT4 defined in the first intermediate organic film 30.

According to an embodiment of the inventive concept, the third sub line corresponding to the control pad line SL-2 and the fourth sub line corresponding to the control signal line CSL may be disposed on different layers. In addition, the control signal line CSL disposed on the first intermediate inorganic film 10 and the first connection lines CNL1a and CNL1b disposed on the first intermediate organic film 30 are disposed on different layers.

Meanwhile, although the structure for the power line PL is not illustrated in this specification, the structure described with reference to FIG. 7 may also be applied substantially the same to the power line PL illustrated in FIG. 3. That is, the power line PL may be disposed on the same layer as the first sub data line DL-S1a illustrated in FIG. 7, and may be electrically connected to a corresponding pad line disposed on the same layer. In this case, the power line PL and the corresponding pad line may be electrically connected to each other through a corresponding connection line disposed on the first intermediate organic film 30.

According to an embodiment of the inventive concept, some of the pad lines and corresponding ones of the data lines may be electrically connected to each other through corresponding ones of the connection lines overlapping the display region. As a result, portions of the some of the pad lines passing through the non-display region adjacent to the corner portion of the display device may be omitted, and thus the display region of the display device may become larger and the non-display region thereof may become smaller.

In addition, as the light shielding layer entirely overlaps the connection lines, elements of the connection lines may be prevented from being viewed from the outside.

As described above, the embodiments have been disclosed in the figures and specification. Although specific terms are employed herein, they are used only for purposes of describing the inventive concept and are not used to limit the scope of the inventive concept as defined in the claims. Accordingly, it is understood that various changes and modifications can be made by those skilled in the art within the spirit and scope of the inventive concept. Therefore, the scope of the inventive concept is defined by the following claims or the equivalents.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:
1. A display device, comprising:
a base substrate having a display region and a non-display region adjacent to the display region;
a drive chip configured to overlap the non-display region and disposed on the base substrate;
a signal line group disposed on the base substrate and including a first signal line with a first sub line electrically connected to the drive chip and a second sub line configured to overlap the display region and spaced apart from the first sub line when viewed in a plane;
an insulating layer configured to cover the signal line group and disposed on the base substrate;
a first connection line which overlaps the display region, is disposed on the insulating layer, and includes one end electrically connected to the first sub line through a first contact hole defined in the insulating layer and the other end electrically connected to the second sub line through a second contact hole defined in the insulating layer;
an encapsulation layer configured to cover the first connection line and disposed on the insulating layer;
a light shielding layer disposed on the encapsulation layer and configured to overlap the first connection line when viewed in the plane; and a color filter layer disposed on the light shielding layer and including a plurality of color filters divided by the light shielding layer.

2. A The display device of claim 1, wherein the display region comprises a plurality of pixel regions and a light shielding region which is adjacent to the pixel regions and is defined by the light shielding layer,
wherein the first connection line entirely overlaps the light shielding region.

3. A The display device of claim 2, wherein an optical density of the light shielding layer is from about 1.0 to about 4.0.

4. A The display device of claim 2, wherein the plurality of pixel regions comprise:
a first pixel region;
a second pixel region; and
a third pixel region,
wherein the plurality of color filters further comprise:
a first color filter which overlaps the first pixel region and has a first color;
a second color filter which overlaps the second pixel region and has a second color different from the first color; and
a third color filter which overlaps the third pixel region and has a third color different from the first color and the second color.

5. A The display device of claim 1, wherein the first sub line at least partially overlaps the first connection line when viewed in the plane.

6. A The display device of claim 1, wherein the first sub line and the second sub line are disposed on the same layer.

7. A The display device of claim 1, wherein the signal line group further comprises:
a second signal line having a third sub line electrically connected to the drive chip and a fourth sub line spaced apart from the third sub line when viewed in the plane; and
a central signal line electrically connected to the drive chip and configured to overlap each of the display region and the non-display region.

8. A The display device of claim 7, wherein the third sub line is disposed between the first sub line and the central signal line when viewed in the plane.

9. A The display device of claim 7, further comprising a second connection line which overlaps the display region, is disposed on the insulating layer, and includes one end electrically connected to the third sub line through a third contact hole defined in the insulating layer and the other end electrically connected to the fourth sub line through a fourth contact hole defined in the insulating layer.

10. A The display device of claim 9, wherein the second connection line at least partially overlaps the second sub line when viewed in the plane.

11. A The display device of claim 9, wherein the first connection line and the second connection line are disposed on the same layer.

12. A The display device of claim 7, wherein the third sub line and the fourth sub line are disposed on different layers, and the fourth sub line and the first connection line are disposed on different layers.

13. A The display device of claim 7, further comprising an intermediate insulating layer disposed between the base substrate and the insulating layer and provided as an organic film,
wherein the first signal line, the central signal line, and the third sub line are disposed on the intermediate insulating layer.

14. A The display device of claim 13, wherein the central signal line is provided in an integral shape through a single process.

15. A The display device of claim 1, wherein the first connection line has a shape that is bent at least once when viewed in the plane.

16. A The display device of claim 1, wherein the first contact hole and the second contact hole overlap the display region.

17. A The display device of claim 1, wherein the signal line group comprises a plurality of data lines arranged on the base substrate,
wherein the first signal line corresponds to one outermost data line of the data lines.

18. A The display device of claim 1, further comprising an input sensing layer disposed between the encapsulation layer and the color filter layer,
wherein the input sensing layer comprises a plurality of conductive patterns configured to overlap the light shielding layer.

19. A The display device of claim 1, wherein the insulating layer is an organic film.

20. A The display device of claim 1, wherein the non-display region comprises a bent region, and at least a portion of the first sub line is bent.

* * * * *